United States Patent [19]

Ito et al.

[11] 4,207,549
[45] Jun. 10, 1980

[54] VHF TELEVISION TUNER CIRCUIT WITH SUPRESSION OF UNDESIRED SIGNALS

[75] Inventors: Katsuo Ito; Kazuo Kontani, both of Kanazawa, Japan

[73] Assignee: Murata Manufacturing Co., Kyoto, Japan

[21] Appl. No.: 910,890

[22] Filed: May 30, 1978

[30] Foreign Application Priority Data

Jul. 7, 1977 [JP] Japan .................................. 52-81814

[51] Int. Cl.² .............................................. H03J 5/00
[52] U.S. Cl. .......................................... 334/1; 334/85
[58] Field of Search .................. 334/1, 49, 55, 56, 85; 325/458-465

[56] References Cited

U.S. PATENT DOCUMENTS

| 3,571,723 | 3/1971 | Ogusu ..................................... 334/1 |
| 4,025,857 | 5/1977 | Miura ..................................... 334/56 |
| 4,112,378 | 9/1978 | Ito et al. ................................ 325/461 |
| 4,128,820 | 12/1978 | Krepps, Jr. ............................. 325/465 |

Primary Examiner—Alfred E. Smith
Assistant Examiner—Thomas P. O'Hare
Attorney, Agent, or Firm—Birch, Stewart, Kolasch & Birch

[57] ABSTRACT

A VHF television tuner circuit is adapted for selecting a channel from a plurality of VHF television channels and a UHF/VHF converted television channel, by mechanical selection to form a resonant circuit having electrical characteristics corresponding to the selected channel. The tuner circuit is coupled to a VHF television signal terminal and a UHF/VHF converted television signal terminal. The tuner circuit comprises a channel selection means including a first switch and a second switch each comprising movable contacts fixedly positioned on a channel selection shaft and stationary contacts corresponding to the selectable channel positions and positioned in proximity to the movable contacts for coaction therewith. The first switch comprises a movable/stationary contact combination positioned in the vicinity of the VHF television signal terminal and responsive to selection of the UHF/VHF converted channel position for being grounded for electrostatically shielding the VHF television signal terminal. The second switch comprises a movable/stationary contact combination responsive to selection of the UHF/VHF converted channel position for connecting the UHF/VHF converted television signal terminal to the radio frequency amplifier.

11 Claims, 7 Drawing Figures

VHF TELEVISION TUNER CIRCUIT WITH SUPRESSION OF UNDESIRED SIGNALS

BACKGROUND OF THE INVENTION

1. Field of the Invention

The present invention relates to a very high frequency television tuner circuit. More specifically, the present invention relates to an improvement in a circuit configuration at the radio frequency amplifying stage in a VHF television tuner for selection of VHF television channels signals and a UHF/VHF converted television channel signal through mechanical switching selection of inductance coils.

2. Description of the Prior Art

Typically, a very high frequency or VHF television tuner includes a mechanical switching selection scheme of inductance coil means for selection of a broadcasting television signal, a radio frequency amplifier operatively coupled to the inductance coil means for selectively amplifying a desired radio frequency signal, and a local oscillator operatively coupled to the inductance coil means for providing a local oscillation frequency signal, the frequency of which is different by a given frequency difference from the selectively amplified radio frequency signal. The tuner also includes a mixer responsive to the selectively amplified radio frequency signal from the radio frequency amplifier and the local oscillation signal from the local oscillator for providing an intermediate frequency signal, and an intermediate frequency tuned circuit for selectively withdrawing the intermediate frequency signal.

The above described mechanical switching selection scheme of inductance coil means may comprise a so-called switch type structure, i.e. a plurality of sets of coils, each set allotted for one channel, provided in a stationary manner along the periphery around a given axis, and a switching contact arrangement rotatably mounted about the axis so as to be rotated by means of a channel selection shaft.

FIG. 1 is a block diagram of a typical VHF television tuner VT. The tuner VT is shown connected to an antenna VA for receiving a broadcasting VHF television wave and comprises a radio frequency amplifier RFA preceded and succeeded by a preceding stage radio frequency tuned circuit RFT1 and a succeeding stage radio frequency tuned circuit RFT2, respectively, for selectively amplifying the desired radio frequency signal, a local oscillator OSC for providing an oscillation frequency signal, the frequency of which is different by a given frequency difference from the selected or desired radio frequency signal, a mixer MIX responsive to the received radio frequency signal from the succeeding stage radio frequency tuned circuit RFT2 and to the local oscillation frequency signal from the local oscillator OSC for providing an intermediate frequency signal, and an intermediate frequency tuned circuit IFT for selectively withdrawing the intermediate frequency signal, which is shown succeeded by an intermediate frequency amplifier IFA in a television receiver.

The tuner shown in FIG. 1 is also shown connected to a UHF/VHF converter UT which is connected to an antenna UA for receiving a broadcasting UHF television wave. Typically, the UHF/VHF tuner is structured to convert a UHF television signal into a VHF television signal of a predetermined frequency and having the same television information. Accordingly, the VHF television tuner VT is adapted to receive selectively the above described VHF television signal of a predetermined frequency converted from the UHF television signal.

The radio frequency tuned circuits RFT1 and RFT2 each comprise inductance coils L1 and L2, respectively, which are to be selected for each channel by means of a mechanical switching selection means (not shown in FIG. 1), described previously, and each are shunted by capacitors C1 and C2, respectively, to form radio frequency tuned circuits. The oscillator OSC also comprises an inductance coil L3, which is also selected for each channel by means of the mechanical switching selection means (not shown in FIG. 1) and is shunted by a capacitor C3 to form an oscillator tuned circuit OSCT. Although the inductance values of the coils L1, L2 and L3 are changeable by means of the mechanical switching selection means, and hence the frequencies of the tuned circuits RFT1, RFT2 and OSCT are accordingly changeable for the purpose of selection of a desired channel, the difference between the frequencies of the radio frequency tuned circuits RFT1 and RFT2 and the oscillator tuned circuit OSCT is kept constant, so that a constant intermediate frequency signal may be obtained from the mixer MIX. Therefore, the intermediate frequency tuned circuit IFT is tuned to the predetermined intermediate frequency.

In implementing a VHF television tuner as shown in FIG. 1 for selection of VHF television channel signals and a UHF/VHF converted television channel signal through mechanical switching selection of inductance coils, it is necessary to selectively connect a few capacitors to the selected radio frequency inductance coils simultaneously with switching selection of the radio frequency inductance coils, as is well known to those skilled in the art. In addition, the tuner should be capable of switching the input terminal to selectively receive a VHF television signal or a UHF/VHF converted television signal. Hence, a conventional VHF television tuner for selection of VHF television channel signals and a UHF/VHF converted television signal through mechanical switching selection of inductance coils comprises a complicated mechanical switching scheme.

A conventional VHF television tuner for selection of VHF television channels and a UHF/VHF converted channel through mechanical switching selection of inductance coils uses one blade for selective connection of each capacitor to be selectively connected to the selected inductance coil between the high and low band channels and also uses one separate blade for selection of the UHF/VHF converted channel; however, this increases the number of sections and the number of blades in the channel selection switch arrangement. This accordingly increases the number of stationary contacts or clips. Thus, the structure of the channel selection switch arrangement for use in the above described VHF television tuner becomes complicated, which makes the cost expensive. In addition, more time is consumed for assemblage of such a VHF television tuner.

An improved VHF television tuner circuit for selection of VHF television channels and a UHF/VHF converted television channel through mechanical switching selection of inductance coil means, which is of interest to the present invention, is described and claimed in the copending U.S. patent application, Ser. No. 780,112, now U.S. Pat. No. 4,112,378 entitled "VHF Television Tuner Circuit", filed by Katsuo Ito et al. and assigned to the same assignee as the present invention. More specifically, the referenced patent application describes a VHF television tuner circuit for selecting a channel from a plurality of VHF television channels including high band, low band, and a UHF/VHF converted television channel, by mechanical selection to form a resonant circuit having electrical characteristics corresponding to the selected channel, and thus to tune to a desired radio frequency signal. The tuner circuit includes a first means for receiving television signals comprising VHF television signals, and producing the VHF television signals as an output thereof; a second means for receiving television signals comprising UHF/VHF converted television signals, and producing the UHF/VHF converted television signals as an output thereof, a channel selection means operator actuable for selecting one of a plurality of channel positions including high band, low band and UHF/VHF converted channel positions corresponding to the selected channel; a plurality of induction coils; a pair of capacitors; and radio frequency amplifying means for selectively amplifying the desired radio frequency signal. The channel selection means includes only a first switch and a second switch; the first switch includes an inhibiting means responsive to selection of the UHF/VHF converted channel position for inhibiting the output of the first receiving means, and means responsive to selection of one of the high band and low band channel positions for connecting corresponding at least one of the plurality of induction coils to the second switch to partially form the resonant circuit. The second switch includes a means responsive to selection of the UHF/VHF converted channel position for connecting the second receiving means to the radio frequency amplifying means, a means responsive to selection of one of the high band channel positions for connecting the pair of capacitors in parallel to corresponding at least one of the plurality of induction coils to completely form the resonant circuit having electrical characteristics corresponding to the selected one of the high band channels. A means is provided which is responsive to selection of one of the low band channel positions for connecting a first one of the pair of capacitors to corresponding at least one of the plurality of induction coils to form a junction therebetween, and for connecting a second one of the pair of capacitors between said junction and said radio frequency amplifying means, whereby to completely form the resonant circuit having electrical characteristics corresponding to the selected one of the low band channels.

According to the invention described and claimed in the referenced patent application, the number of stages of the switching arrangement for the radio frequency tuned circuit is decreased while the electrical characteristic of the tuner circuit is maintained and thus the number of circuit components is decreased which is required for the radio frequency tuned circuit in a VHF television tuner for selection of VHF television channels and a UHF/VHF converted television channel through mechanical switching selection of inductance coil means.

According to a preferred embodiment of the invention of the referenced patent application, the inhibiting means of the first switch comprises means for establishing an open circuit at the first receiving means output. As a result, if and when the UHF/VHF converted channel position is selected, the VHF television signal path is disconnected from the first receiving means. In general, the first and second switching means are provided at the front and rear surfaces of an insulating plate, which causes a stray capacitance therebetween. Therefore, if the VHF television signal transmission path had been connected to the first receiving means when the UHF/VHF converted channel position had been selected, then a cross feed interference of the VHF signal component could have occurred through the stray capacitance. However, according to the above described preferred embodiment of the referenced invention, such cross feed interference is effectively eliminated and the so-called UHF/VHF separation characteristic is advantageously improved, because the VHF television signal path is disconnected from the first receiving means.

Typically, the first switch comprises a plurality of stationary contacts corresponding to the selectable UHF/VHF converted channel position, the high band channel positions and the low band channel positions, and movable contacts positioned in proximity to the stationary contacts for coaction therewith. On the other hand, the first switch includes the inhibiting means responsive to selection of the UHF/VHF converted channel position for inhibiting the output of the first receiving means. Thus, it follows that a VHF television signal transmission path including the first receiving means is positioned in the vicinity of some of the plurality of stationary contacts. However, this causes another stray capacitance between the first receiving means and the adjacent stationary contacts, which also induces a cross feed interference of the VHF signal component through the stray capacitance and further through the inductance coils to the radio frequency amplifier and thus deteriorates the UHF/VHF separation characteristic: In this context, the VHF television tuner circuit of the referenced patent application still includes room for improvement in the UHF/VHF separation characteristic.

SUMMARY OF THE INVENTION

The present invention is directed to an improvement in a VHF television tuner circuit for selecting a channel from a plurality of VHF television channels and a UHF/VHF converted television channel, by mechanical selection to form a resonant circuit having electrical characteristics corresponding to said selected channel, and thus to tune to a desired radio frequency signal. The tuner circuit includes a first means for receiving television signals comprising VHF television signals, and producing said VHF television signals as an output thereof; a second means for receiving television signals comprising UHF/VHF converted television signals, and producing said UHF/VHF converted television signals as an output thereof; channel selection means operator actuable for selecting one of a plurality of channel VHF television channel positions and a UHF/VHF converted channel position corresponding to said selected channel; a plurality of induction coils; capacitor means; and radio frequency amplifying means for selectively amplifying said desired radio frequency signal. According to the present invention, the improvement resides in that said channel selection means includes open circuit means responsive to selection of said UHF/VHF converted channel position for establishing an open circuit at the output of said first receiving means, means responsive to selection of one of said VHF television channel positions for connecting corresponding at least one of said plurality of induction coils to partially form said resonant circuit, means responsive to selection of said UHF/VHF converted channel position for connecting said second receiving means to said radio frequency amplifying means, means responsive to selection of one of said VHF television channel positions for connecting said capacitor means to corresponding at least one of said plurality of induction coils to completely form said resonant circuit having electrical characteristics corresponding to said selected one of the VHF television channels, and means positioned in the vicinity of the first receiving means and responsive to selection of said UHF/VHF converted channel position for being grounded for electrostatically shielding said first receiving means.

In a preferred embodiment of the present invention, said plurality of VHF television channels includes high band and low band channels, said capacitor means comprises a pair of capacitors, and said means responsive to selection of one of said VHF television channel positions for connecting the capacitor means comprises means responsive to selection of one of said high band channel positions for connecting only one of said pair of capacitors to corresponding at least one of said plurality of induction coils to completely form said resonant circuit having electrical characteristics corresponding to said selected one of said high band channels, and means responsive to selection of one of said low band channel positions for connecting said pair of capacitors in series and connecting said series connection to corresponding at least one of said plurality of induction coils to form said resonant circuit having electrical characteristics corresponding to said selected one of said low band channels. In a further preferred embodiment of the present invention, said means responsive to selection of one of said high band channel positions for connecting one of said pair of capacitors to corresponding at least one of said plurality of induction coils and means responsive to selection of one of said low band channel positions for connecting said pair of capacitors in series and connecting said series connection to corresponding at least one of said plurality of induction coils, and means positioned in the vicinity of said first receiving means and responsive to selection of said UHF/VHF converted channel position for being grounded may be implemented by common switch contacts.

Therefore, a principal object of the present invention is to provide an improved VHF television tuner circuit for selection of VHF television channels and a UHF/VHF converted television channel through mechanical switching selection of inductance coil means.

Another object of the present invention is to provide an improved VHF television tuner circuit for selection of VHF television channels and a UHF/VHF converted television channel through mechanical switching selection of inductance coil means, wherein a cross feed interference of the VHF signal component to the UHF/VHF converted signal component through a stray capacitance is decreased and the UHF/VHF separation characteristic is improved.

A further object of the present invention is to provide an improved VHF television tuner circuit for selection of VHF television channels and a UHF/VHF converted television channel through mechanical switching selection of inductance coil means, wherein the number of stages of the switching arrangement for the radio frequency tuned circuit is decreased while the electrical characteristic of the tuner circuit is maintained and thus the number of circuit components is decreased which is required for the radio frequency tuned circuit in a VHF television tuner for selection of VHF television channels and a UHF/VHF converted television channel through mechanical switching selection of inductance coil means.

Still a further object of the present invention is to simplify assemblage of a VHF television tuner for selection of VHF television channels and a UHF/VHF converted television channel through mechanical switching selection of inductance coil means, whereby the time for assemblage and thus cost for assemblage is decreased.

These objects and other objects, features, aspects and advantages of the present invention will become more apparent from the following detailed description of the preferred embodiments of the present invention made in conjunction with the accompanying drawings.

DESCRIPTION OF THE PREFERRED EMBODIMENTS

Figure 2:
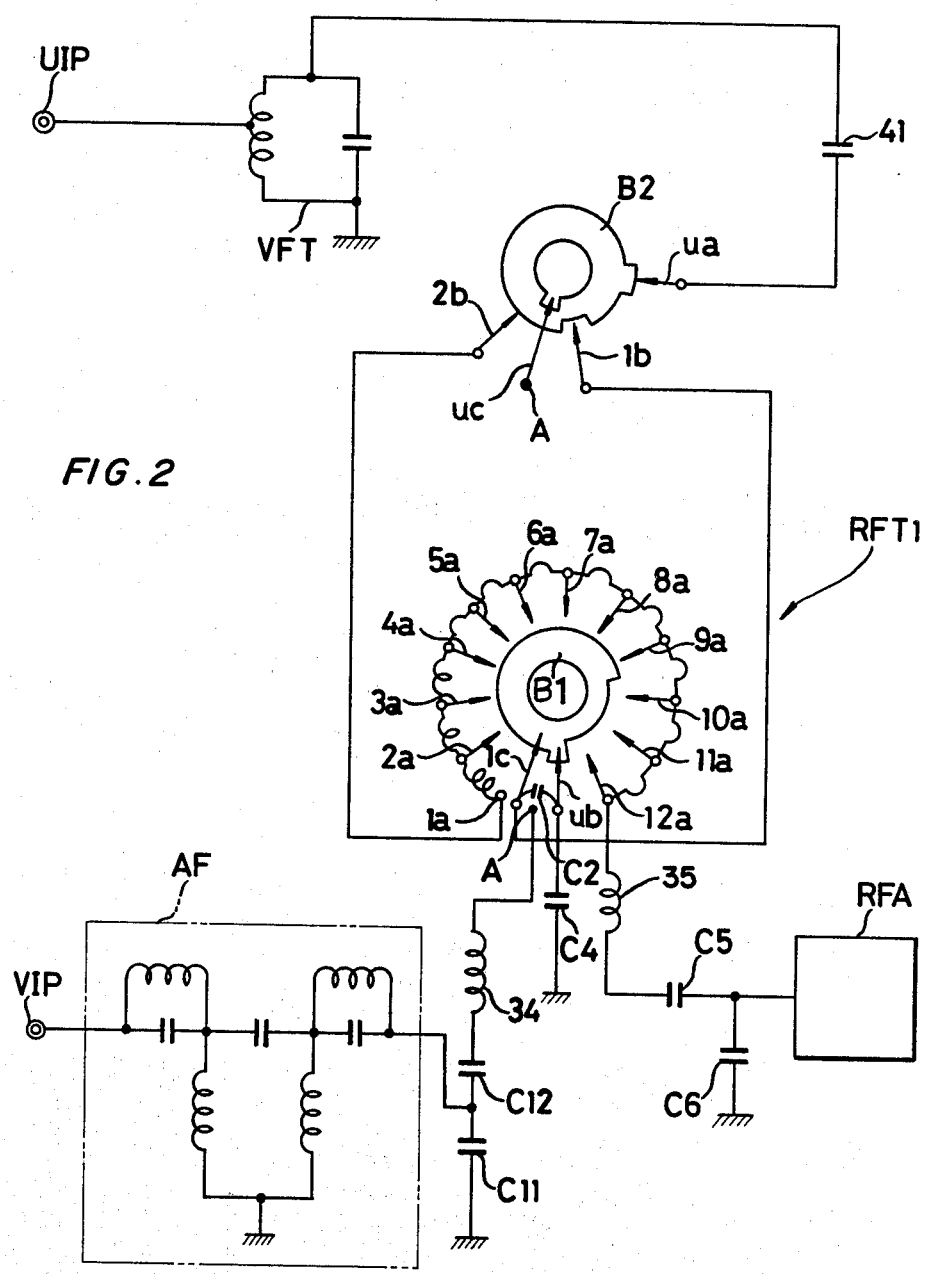
FIG. 2 is a schematic diagram of only the radio frequency tuned circuit RFT1 and the radio frequency amplifier RFA of an embodiment of the present invention.

FIG. 2 shows a schematic diagram of one embodiment of the inventive VHF television tuner circuit for selection of a VHF television signal and a UHF/VHF converted television signal through the mechanical switching selection of inductance coils, in which only the preceding radio frequency tuned circuit RFT1 and a radio frequency amplifier RFA are schematically shown. A VHF signal input terminal VIP is connected through an antenna filter AF to the radio frequency tuned circuit RFT1. The antenna filter AF comprises a well known high pass filter of an LC type and is provided to prevent any interferance signal of the intermediate frequency band from being transferred to the subsequent stages. The output from the antenna filter AF is connected to the junction of the capacitors C11 and C12 which constitute a capacitance divider circuit and serve to constitute a portion of the capacitance for the radio frequency tuned circuit RFT1. The terminal of the capacitor C12 is connected through an auxiliary inductance coil 34 to the junction A.

The mechanical switching scheme of the embodiment shown comprises two sets of switches to implement the radio frequency tuned circuit RFT1. More specifically, the mechanical switching scheme for the radio frequency tuned circuit RFT1 comprises two blades or movable contacts B1 and B2, each operatively associated with stationary contacts, as shown in the figure. The first and second blades B1 and B2 are formed on the front and rear surfaces of a rotor, not shown, fixedly provided on the channel selection shaft at the corresponding sections in the tuner.

The first blade B1 is first aimed to short circuit a capacitor C2 only for the high band channels and the UHF/VHF converted channel. According to the Japanese television standard system, the low band channels include numbers 1, 2 and 3 and the high band channels include channel numbers 4 through 12. This blade B1 is also aimed to selectively switch the inductance coils. To that end, coil elements, spirally wound, are each connected between the adjacent two stationary contacts 1a through 12a. For the purpose of individual selection of inductance coils for each channel, the blade B1 has the largest diameter portion of one channel width so as to individually contact each of stationary contacts 2a through 12a. In order to short circuit the capacitor C2 only for the high band channels and the UHF/VHF converted channel, the blade B1 further has a medium diameter portion to cover the high band channels and the UHF/VHF converted channel, while the remaining portion of the blade B1 is selected to be of the smallest diameter portion. The stationary contacts 1c and ub are connected across the capacitor C2 and the contact 1c is extended to reach the smallest diameter portion while the stationary contact ub is extended to reach the medium diameter portion of the blade B1. The stationary contact ub is grounded through a capacitor C4 of a relatively large value. The stationary contact 12a is connected through an inductance coil 35 and a capacitance dividing circuit including capacitors C5 and C6 to the input of the radio frequency amplifier RFA.

According to the essential feature of the present invention, it is important that the junction A coupled from the VHF signal input terminal VIP is located intermediate the stationary contacts 1c and ub, as to be more fully described subsequently. The junction A is coupled from the VHF signal input terminal VIP on the surface of the blade B1 and is adapted to extend through the rotor plate for mounting the stationary contacts to come out on the surface of the blade B2. Thus, the junction A on the surfaces of the blades B1 and B2 are denoted by the dot mark identified by the same reference character A.

The second blade B2 is used to selectively connect a UHF/VHF converted signal input terminal UIP to the radio frequency amplifier RFA and to establish an open circuit at the VHF signal transmission path. To that end, the UHF/VHF converted input signal terminal UIP is connected to a VHF tuned circuit VFT and the output therefrom is connected through a capacitor 41 to a stationary contact ua corresponding to the UHF/VHF converted channel position. The second blade B2 has the UHF/VHF converted channel portion formed of a larger diameter and the remaining portion formed of a smaller diameter, so that if and when the channel switching scheme is turned to the UHF/VHF converted channel the UHF/VHF converted signal input terminal UIP is coupled to the blade B2 and further through the inductance coils to the radio frequency amplifier RFA. To that end, another stationary contact 2b is provided to extend to reach the intermediate diameter portion of the balde B2 and is connected to the stationary contact 1a for the first blade B1. Referring further to the second blade B2, the second blade B2 is further formed of a first notch of one channel width on the inner periphery of the blade B2 and a further stationary contact uc is provided from the junction A to extend to reach the inner periphery notch, so that if and when the channel switching scheme is turned to the UHF/VHF converted channel the stationary contact uc and thus the VHF channel signal transmission path is open circuited. The second blade B2 is formed of a further notch of one channel width at the outer periphery of the blade B2 and a stationary contact 1b is provided to extend to reach the outer periphery notch, which stationary contact 1b is connected to the stationary contact 1c for the first blade B1, so that if and when the channel switching scheme is turned to the UHF/VHF converted channel the stationary contact 1c is open circuited and otherwise coupled to the second blade B2.

Figure 3A:
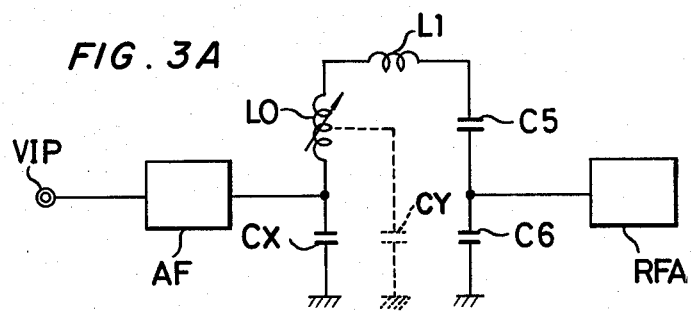
FIG. 3A shows an equivalent circuit of the FIG. 2 embodiment when the channel selection switch of the tuner is turned to any one of the high band channels.
Figure 3B:
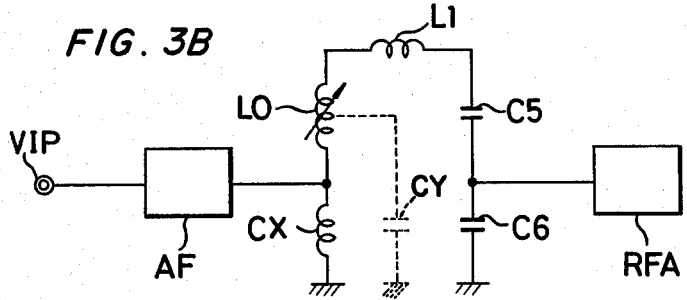
FIG. 3B shows an equivalent circuit, in a simplified manner, of the FIG. 3A equivalent circuit.
Figure 3C:
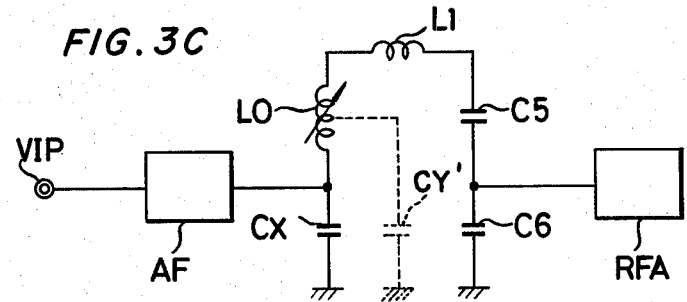
FIG. 3C shows an equivalent circuit of the FIG. 2 embodiment when the channel selection switch is turned to any one of the low band channels.
Figure 3D:
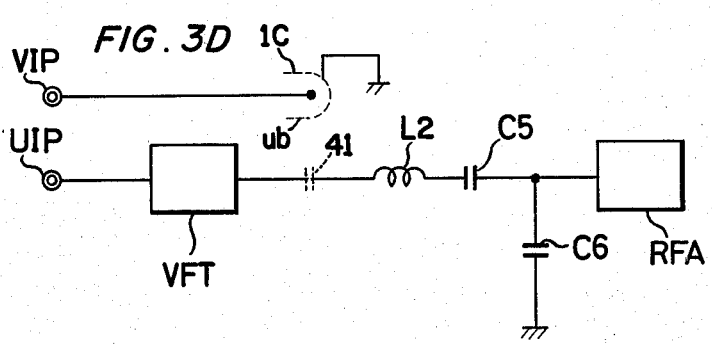
FIG. 3D shows an equivalent circuit of the FIG. 2 embodiment when the channel selection switch is turned to the UHF/VHF converted channel.

FIG. 3A shows an equivalent circuit of the FIG. 2 embodiment when the channel selection switch of the tuner is turned to any one of the high band channels, FIG. 3B shows an equivalent circuit, in a simplified manner, of the FIG. 3A equivalent circuit, FIG. 3C shows an equivalent circuit of the FIG. 2 embodiment when the channel selection switch is turned to any one of the low band channels, and FIG. 3D shows an equivalent circuit of the FIG. 2 embodiment when the channel selection switch is turned to the UHF/VHF converted channel. With simultaneous reference to FIGS. 3A through 3D, the operation of the FIG. 2 embodiment will be described.

In operation, assuming that the channel selection shaft, not shown, is turned to any one of the high band channels, the stationary contact ua for the UHF/VHF converted signal input terminal UIP is open circuited, while the stationary contact uc for the junction A and thus for the VHF signal input terminal VIP is brought in contact with the blade B2. Therefore, a VHF signal transmission path is established through the inductance coil 34, the junction A, the stationary contact uc, the blade B2, the stationary contact 2b, the stationary contact 1a, the inductance coils, and the stationary contact 12a, the inductance coil 35 and the capacitance dividing circuit including the capacitors C5 and C6 to the radio frequency amplifier RFA. On the other hand, the stationary contact 1b is brought in contact with the blade B2, so that a portion of the inductance coils is short circuited by a connection from the stationary contact 1b to the stationary contact 1c. On the other hand, the stationary contacts 1c and ub are also short circuited by the first blade B1 and thus the capacitor C2 is short circuited. As a result, the equivalent circuit shown in FIG. 3A is attained. Referring to FIG. 3A, the inductance of the inductance coil 35 is denoted by L1, the inductance of the inductance coils provided in association with the blade B1 and the inductance coil 34 is denoted by L0, the capacitance of the capacitor C4 is denoted by CY, and the capacitance of the series connection of the capacitors C11 and C12 is denoted by CX. For simplicity of illustration, the output of the antenna filter AF is shown connected to the junction between the inductance L0 and the capacitance CX in FIG. 3A. Referring to FIG. 3A, the capacitance CX is relatively large. Therefore, the capacitance C4 can be deemed as an inductance element of a small inductance value in terms of the frequency of the high band channels. Thus, the FIG. 3A equivalent circuit may be changed to a simplified equivalent circuit as shown in FIG. 3B. Thus, it is appreciated that only the capacitors C5 and C6 are connected to the above described set of inductance coils L1, L0 and CX.

When the channel selection switch is turned to any one of the low band channels, the stationary contacts 1c and ub are open circuited by virtue of the smallest diameter portion of the blade B1. On the other hand, a set of the inductance coils is selected by the position of the largest diameter portion of the blade B1. The connection of other portion when any one of the low band channels is selected is substantially the same as that when any one of the high band channels is selected. Therefore, it is not believed necessary to describe the same in more detail. Thus, the equivalent circuit as shown in FIG. 3C is attained. With particular reference to FIG. 3C, the first and second capacitors C2 and C4 are included in series in the resonance circuit as a composite capacitance CY.

Now assume a case where the channel selection shaft is turned to the UHF/VHF converted channel. The stationary contact uc for the second blade B2 is open circuited by virtue of the inner periphery notch of the blade B2, whereby an open circuit is established in the VHF signal transmission path. On the other hand, the stationary contact ua is brought in contact with the largest diameter portion of the blade B2 and thus the UHF/VHF converted signal transmission path is established through the capacitor 41, the stationary contact ua, the blade B2, the stationary contact 2b, the stationary contact 1a, the inductance coils, and the stationary contact 12a the inductance coil 35 and the capacitance dividing circuit including the capacitors C5 and C6 to the input of the radio frequency amplifier RFA. On the other hand, when the UHF/VHF converted channel is selected, the stationary contacts 1c and ub are short circuited and are grounded through the capacitor C4 of a larger capacitance value. Thus, the equivalent circuit as shown in FIG. 3D is attained. Referring to FIG. 3D, the inductance of the inductance coil 35 and the inductance coil provided in association with the blade B1 is denoted by L2. It is recalled that the junction A is provided intermediate the terminals for the stationary contacts 1c and ub. As discussed in the section entitled DESCRIPTION OF THE PRIOR ART, such junction A constituting the VHF signal transmission path could induce a cross feed interference through a stray capacitance between the junction A and the adjacent stationary contacts such as 1a, 12a and the like, when the UHF/VHF converted channel is selected. According to the present invention, however, the junction A is positioned intermediate electrical conductors such as the stationary contacts 1c and ub, which are placed in the vacinity of the junction A and forced to a ground potential. As a result, the electrical conductor including the junction A is effectively shielded by means of the electrical conductors such as the stationary contacts 1c and ub in an electrostatic manner and thus a cross feed interference through a stray capacitance between the junction A and the adjacent stationary contacts is effectively eliminated. As a result, the UHF/VHF separation characteristic is enhanced.

Figure 1:
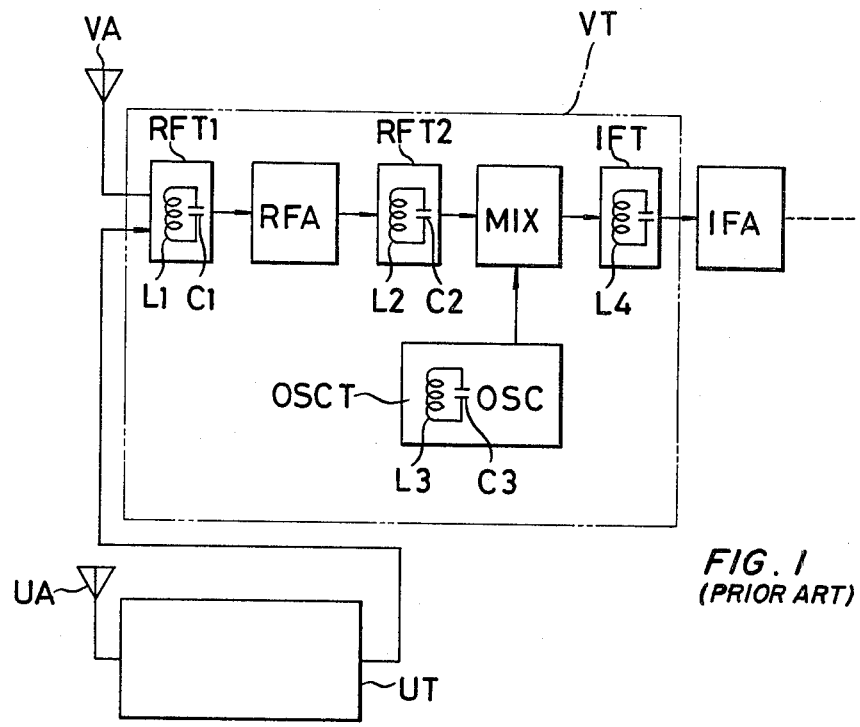
FIG. 1 is a block diagram of a typical VHF television tuner VT.
Figure 4:
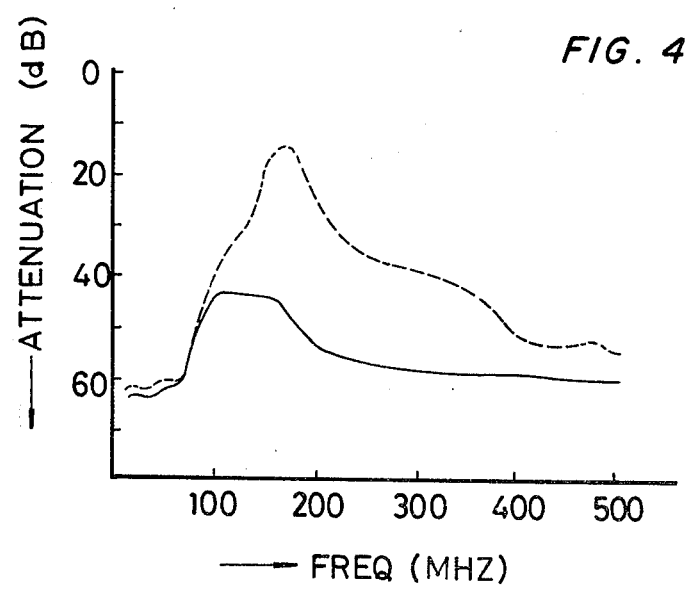
FIG. 4 is a graph showing a comparison of the UHF/VHF separation characteristic of the FIG. 2 embodiment.

FIG. 4 is a graph showing a comparison of the UHF/VHF separation characteristic of the FIG. 2 embodiment. Referring to FIG. 4, the abscissa indicates the frequency of the signal, while the ordinate indicates an attenuation of an undesired signal transmitted from the VHF input terminal VIP with respect to a desired signal transmitted from the UHF/VHF converted input terminal UIP to the transistor implementing the radio frequency amplifier RFA. In the graph, the solid line curve shows the UHF/VHF separation characteristic of the FIG. 2 embodiment and the dotted line curve shows the UHF/VHF separation characteristic of the VHF tuner circuit discussed in the section entitled DESCRIPTION OF THE PRIOR ART. It is seen from the graph that according to the FIG. 2 embodiment the attenuation of an undesired signal level with respect to the desired signal level becomes the value far exceeding 40 dB. Such an improved UHF/VHF separation characteristic is achieved by full disconnection of the transmission path from the VHF input terminal VIP and electrostatic shielding of the connection to the VHF input terminal VIP on the occasion of selection to the UHF/VHF converted channel by the inventive tuner.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A VHF television tuner circuit for selecting a channel from a plurality of VHF television channels and a UHF/VHF converted television channel, by mechanical selection to form a resonant circuit having electrical characteristics corresponding to said selected channel, and thus to tune to a desired radio frequency signal, said turner circuit comprising:

first means for receiving television signals comprising VHF television signals, and producing said VHF television signals as an output thereof;

second means for receiving television signals comprising a UHF/VHF converted television signal, and producing said UHF/VHF converted television signal as an output thereof;

channel selection means for selecting one of a plurality of channel positions including VHF television channels and a UHF/VHF converted television channel corresponding to said selected channel;

a plurality of induction coils;

capacitor means; and radio frequency amplifying means for selectively amplifying said desired radio frequency signal;

open circuit means responsive to selection of said UHF/VHF converted channel position for establishing an open circuit at the output of said first receiving means;

means responsive to selection of one of said VHF television channel positions for connecting corresponding at least one of said plurality of induction coils, means responsive to selection of said UHF/VHF converted channel position for connecting said second receiving means to said radio frequency amplifying means, means responsive to selection of one of said VHF television channel positions for connecting said capacitor means to corresponding at least one of said plurality of induction coils, thereby forming said resonant circuit having electrical characteristics corresponding to said selected one of said VHF television channels, and means positioned in the vicinity of said first receiving means and responsive to selection of said UHF/VHF converter channel position for electrostatically shielding said first receiving means.

2. A VHF television tuner circuit for selecting a channel from a plurality of VHF television channels and a UHF/VHF converted television channel in accordance with claim 1, wherein said channel selection means comprises a channel selection shaft, movable contacts fixedly positioned on said channel selection shaft, and stationary contacts corresponding to said selectable channel positions and positioned in proximity to said movable contacts for coaction therewith.

3. A VHF television tuner circuit for selecting a channel from a plurality of VHF television channels and a UHF/VHF converted television channel in accordance with claim 2, wherein said plurality of VHF television channels include a high band and a low band, said capacitor means comprises a pair of capacitors, and said means responsive to selection of one of said VHF television channel positions for connecting said capacitor means comprises means responsive to selection of one of said high band channel positions for short circuiting one of said pair of capacitors and for connecting the other of said pair of capacitors to corresponding at least one of said plurality of induction coils, thereby forming said resonant circuit having electrical characteristics corresponding to said selected one of said high band channels, and means responsive to selection of one of said low band channel positions for connecting said pair of capacitors in series and for connecting said series connection to corresponding at least one of said plurality of inductions coils, thereby forming said resonant circuit having electrical characteristics corresponding to said selected one of said low band channels.

4. A VHF television tuner circuit for selecting a channel from a plurality of VHF television channels and a VHF/UHF converted television channel in accordance with claim 3, wherein said channel selection means includes only a first switch and a second switch, said first switch including;

said means responsive to selection of one of said high band and low band channel positions for connecting corresponding at least one of said plurality of induction coils to form said resonant circuit, said means responsive to selection of one of said high band channel positions for short circuiting one of said pair of capacitors and for connecting the other of said pair of capacitors to corresponding at least one of said plurality of induction coils, thereby forming said resonant circuit having electrical characteristics corresponding to said selected one of said high band channels, said means responsive to selection of one of said low band channel positions for connecting said pair of capacitors in series and for connecting said series connection to corresponding at least one of said plurality of induction coils, thereby forming said resonant circuit having electrical characteristics corresponding to said selected one of said low band channels, and said means positioned in the vicinity of said first receiving means and responsive to selection of said UHF/VHF converted channel position for being grounded for electrostatically shielding said first receiving means, and said second switch including;

said open circuit means responsive to selection of said UHF/VHF converted channel position for establishing an open circuit at the output of said first receiving means, and said means responsive to selection of said UHF/VHF converted channel position for connecting said second receiving means to said radio frequency amplifying means.

5. A VHF television tuner circuit for selecting a channel from a plurality of VHF television channels and a UHF/VHF converted television channel in accordance with claim 4, wherein said first switch comprises a plurality of stationary contacts corresponding to said selectable UHF/VHF converted channel position, said high band channel positions and said low band channel positions, and movable contacts positioned in proximity to said stationary contacts for coaction therewith.

6. A VHF television tuner circuit for selecting a channel from a plurality of VHF television channels and a UHF/VHF converted television channel in accordance with claim 5, wherein said induction coils are each coupled between corresponding adjacent two stationary contacts of said first switch corresponding to said high and low band channel positions, and said movable contacts are positioned in proximity to corresponding said stationary contacts for coaction therewith so as to select said corresponding at least one of induction coils for connection to said second switch.

7. A VHF television tuner circuit for selecting a channel from a plurality of VHF television channels and a UHF/VHF converted television channel in accordance with claim 6, wherein said second switch comprises first stationary contact coupled to said second receiving means, second stationary contact coupled to one end of said connection of said inductance coils, third stationary contact coupled to said means responsive to selection of one of said high band channel positions for short circuiting one of said pair of capacitors and for connecting the other of said pair of capacitors to corresponding at least one of said plurality of induction coils, and fourth stationary contact coupled to said first receiving means, and said movable contacts to said second switch are positioned in proximity of said first stationary contact for coaction therewith in correspondence to said UHF/VHF converted channel position of said channel selection shaft, are positioned in proximity to said second stationary contact corresponding to at least said UHF/VHF converted channel position of said channel selection shaft to coact therewith to establish the UHF/VHF converted signal transmission path to said radio frequency amplifying means, and are positioned in proximity to said third and fourth stationary contacts corresponding to said UHF/VHF converted channel position of said channel selection shaft to open said third and fourth stationary contacts and coact therewith at the remaining channel positions of said channel selection shaft.

8. A VHF television tuner circuit for selecting a channel from a plurality of VHF television channels and a UHF/VHF converted television channel in accordance with claim 2, wherein said means responsive to selection of said UHF/VHF converted channel position for electrostatically shielding said first receiving means comprises at least two stationary contacts provided at the opposite sides of said first receiving means.

9. A VHF television tuner circuit for selecting a channel from a plurality of VHF television channels and a UHF/VHF converted television channel in accordance with claim 5, wherein said means responsive to selection of said UHF/VHF converted channel position for electrostatically shielding said first receiving means comprises at least two of said plurality of stationary contacts corresponding to said selectable UHF/VHF converted channel position and one adjacent VHF channel position.

10. The VHF television tuner circuit of claim 1 wherein said channel selection is operator actuable.

11. The VHF television tuner circuit of claim 1 wherein said means for electrostatically shielding is connected to ground.

* * * * *